United States Patent

Hermansson et al.

[11] Patent Number: 5,914,499
[45] Date of Patent: Jun. 22, 1999

[54] HIGH VOLTAGE SILICON CARBIDE SEMICONDUCTOR DEVICE WITH BENDED EDGE

[75] Inventors: Willy Hermansson, Vasteras; Lennart Ramberg, Bromma; Dag Sigurd, Enskededalen, all of Sweden

[73] Assignee: ABB Research Ltd., Zurich, Switzerland

[21] Appl. No.: 08/716,252

[22] PCT Filed: Jan. 17, 1996

[86] PCT No.: PCT/SE96/00034

§ 371 Date: Mar. 5, 1997

§ 102(e) Date: Mar. 5, 1997

[87] PCT Pub. No.: WO96/22610

PCT Pub. Date: Jul. 25, 1996

[30] Foreign Application Priority Data

Jan. 18, 1995 [SE] Sweden .................................. 9500146

[51] Int. Cl.⁶ ...................... H01L 31/0312; H01L 29/00; H01L 29/06
[52] U.S. Cl. .......................... 257/77; 257/510; 257/622; 438/43; 438/39; 438/931
[58] Field of Search ............................ 257/77, 510, 622; 438/39, 42, 43, 931

[56] References Cited

U.S. PATENT DOCUMENTS

| | | | |
|---|---|---|---|
| 3,397,448 | 8/1968 | Tucker | 438/931 |
| 3,636,397 | 1/1972 | Addamiano et al. | 257/77 |
| 5,270,244 | 12/1993 | Baliga | 437/67 |
| 5,399,883 | 3/1995 | Baliga | 257/57 |
| 5,449,925 | 9/1995 | Baliga et al. | 257/77 |
| 5,650,654 | 7/1997 | Nobel | 257/372 |

FOREIGN PATENT DOCUMENTS

WO 95/32524  of 1995  WIPO .

OTHER PUBLICATIONS

Taylor, Paul D., "Thuristor Design and Realization", John Wiley & Sons, Inc., pp. 41–45, Jan. 1, 1987.
Neudeck et al., 2000 V 6H–SiC P–N Junction Diodes Grown By Chemical Vapor Deposition. Appl Phys Lett 64 (11), Mar. 14, 1994, pp. 1386–1388.
Alok et al., A Simple Edge Termination for Silicon Carbide Devices with Nearly Ideal Breakdown Voltage, IEEE Electron Device Letters, vol. 15, No. 10, Oct. 1994. pp. 394–395.
Alok et al., Thermal Oxidation of 6H–Silicon Carbide at Enhanced Growth Rates, IEEE Electron Device Letters. vol. 15, No. 10, Oct. 1994, pp. 424–426.
Bhatnagar et al., Comparison of 6H–SiC, 3C–SiC, and Si For Power Devices. IEEE Transactions on Electron Devices, vol. 40, No. 3, Mar. 1993, pp. 645–655.
Konstantinov et al., Passivation of Crystalline Silicon Carbide in a Hydrogen Plasma. Semiconductors 28 (2), Feb. 1994, pp. 209–210.

Primary Examiner—Olik Chaudhuri
Assistant Examiner—Howard Weiss
Attorney, Agent, or Firm—Pollock, Vande Sande & Amernick

[57] ABSTRACT

The invention relates to a method in which proton or ion implantation is used for restructuring a silicon carbide region from being conductive to being resistive and wherein this implantation method is used for manufacturing a semiconductor device which comprises a p-n junction where both the p-conductive and the n-conductive layers are designed as doped layers of silicon carbide (SiC), whereby the implantation method is used for at least one of the steps passivation of a silicon carbide surface of the device with a semi-insulating layer, definition of the area of the p-n junction during manufacture, termination of the edges of the p-n junction by means of a semi-insulating layer, creation of a positive edge angle at the edge of the p-n junction, and insulation of different devices from one another during manufacture of a plurality of devices on one and the same wafer of silicon carbide, wherein the invention also relates to the implantation method proper.

5 Claims, 4 Drawing Sheets

HIGH VOLTAGE SILICON CARBIDE SEMICONDUCTOR DEVICE WITH BENDED EDGE

TECHNICAL FIELD

The present invention relates to a semiconductor device with silicon carbide as base material. Proton or ion implantation is used for restructuring a region of the silicon carbide from being conductive to being resistive, wherein the method is used both for defining the area of a p-n junction during manufacture of a component and for edge terminating the p-n junction and for passivating the surface of the component. Further, the method is used for creating a positive edge angle at the edge of the p-n junction. The invention also relates to the implantation method itself.

BACKGROUND ART

Semiconductor devices based on silicon carbide (SiC) as base material are continuously developed to be used in high-temperature contexts, high-power applications and under conditions involving a high radiation, under which circumstances conventional semiconductors cannot function satisfactorily. Estimations indicate that SiC transistors of power MOSFET type and diode rectifiers of SiC could operate over larger voltage and temperature intervals, for example up to 650°–800° C., and exhibit better breaker properties with lower losses and higher frequencies, and still be 20 times smaller in volume than corresponding silicon components. These improvements are due to the inherent advantageous material properties which silicon carbide possesses in relation to silicon, as for example a higher breakdown field (up to 10 times higher than silicon), a higher thermal conductivity (more than 3 times higher than silicon), and a higher energy band gap (2.9 eV for 6H—SiC, one of the crystal structures for SiC).

Since the silicon-carbide semiconductor technique is relatively young and in many respects non-optimized, there are many critical manufacturing problems which require a solution before fully useful SiC power semiconductors may be realized experimentally and manufacture in larger quantities may be carried out. This is especially true of components intended for high-power and high-voltage applications. Difficulties requiring a solution are that the background doping concentration for the voltage-absorbing layer in the component must be reduced for one single component to be able to withstand voltages of several kilovolts, that the surface passivation technique of the silicon carbide must be optimized, and that the quantity of critical defects in the silicon carbide material must be reduced if, for example, heavy-current components with large areas are to be manufactured. Other areas which require development are, for example, methods for manufacturing good ohmic contacts for the material, methods for doping with, for example, implantation, and process techniques for, for example, etching, etc.

Manufacturing high-volt diodes in 6H—SiC with epitaxially created p-n junctions and Schottky junctions has been carried out for experimental purposes (see, e.g., M. Bhatnagar and B. J. Baliga, IEEE Trans. Electron Devices, Vol. 40, No. 3, pp 645–655, March 1993, or P. G. Neudeck, D. J. Larkin, J. A. Powell, L. G. Matus and C. S. Salupu, Appl. Phys. Lett., Vol. 64, No. 11, 14 Mar. 1994, pp 1386–1388). Some of the problems described above have been solved, such as among other things the reduction of the doping concentration, whereby the first 2000 V silicon carbide diodes ever have been reported. This has been realizable because of the progress of development in recent years for manufacturing substrate materials in silicon carbide.

However, no simple method for surface-passivating silicon carbide useful for restructuring the surface of a silicon carbide material for obtaining a high-resistance layer from the surface down to a desired depth is known.

Another difficulty to master during manufacture of high-volt diodes or other semiconductor devices with a voltage-absorbing p-n junction is to achieve a suitable termination of the edge of the p-n junction. The electric field across the p-n junction at the edge of thereof is very large when a high reverse voltage is applied across the p-n junction. This problem has not been solved in the above-mentioned known diodes. Many of the problems which remain to be solved during development of semiconductor devices in SiC bear a strong resemblance to those which occurred when the corresponding silicon components were introduced. Still, the same techniques cannot be applied for solution of the specific problems relating to the manufacture of silicon carbide components as with the currently known solutions for the corresponding production of silicon components. As an example, it may be mentioned that doping by diffusion in SiC is very difficult to carry out, since diffusion coefficients are negligible below about 2270K. Also ion implantation of dopants, which is a common technique when manufacturing silicon components, is difficult to master and not developed for silicon carbide.

A high voltage in the reverse direction with the ensuing strong electric field at the edge of a p-n junction gives a great risk of breakdown or flashover at the edge of the p-n junction. Where the p-n junction emerges at the surface of a component, an increase of the electric field arises compared with the situation at the p-n junction further inside the component. This has to do with a change from more homogeneous conditions inside the component to the abrupt step out of the material at the surface. This fact makes it important to reduce the field at the surface and to passivate the surface. Combined with the surface of a silicon comonent being passivated, measures are also taken to equalize the field at the surface by, for example, influencing how the p-n junction emerges to the surface. In connection with power components, for example, lapping (grinding) of the surface is performed at a certain angle through the p-n junction in order thus to equalize the field. In these contexts, the designation negative edge angle is used for designating that a wafer with a p-n junction has an increasing area when proceeding from a layer with a high doping concentration to a layer with a low doping concentration (e.g, from a p-region with a high to an n-region with a low doping concentration). Correspondingly, a positive edge angle designates that a p-n junction has a decreasing area in a direction towards the layer with a low doping concentration (e.g. in a direction from a p-region with a high to an n-region with a low doping concentration). For example in FIG. 3, angle α should be between 0° and 90° to form a positive edge angle. One way of reducing the electric field at the edge of a p-n junction is to design the p-n junction with a positive edge angle, whereby this edge angle in the case of known semiconductor materials is achieved by means of grinding of the edge, a method which does not occur at all in a silicon carbide component.

A further method of reducing the field concentration at the edge of the p-n junction is to gradually reduce the p-doping up towards the surface in a ring peripherally around the p-n junction (so-called junction termination extension) for reducing the field at the surface. These methods known from the silicon technique are difficult to apply to materials in SiC because the material is hard, doping with diffusion is difficult to carry out, etc.

For terminating a p-n junction with silicon as base material, it is known, for example, to provide the edge of the p-n junction with a semi-insulating layer with a certain desired, very small conductivity. This layer, when a high voltage in the reverse direction is applied to the p-n junction, carries a weak current in the reverse direction via this semi-insulating layer, whereby the electric field at the edge of the p-n junction decreases and the risk of voltage breakdown is considerably reduced. The patent document SE 9400482 shows a method of edge terminating and passivating a p-n junction designed in an SiC base material. The present invention describes an additional solution to this problem.

It is further known to achieve edge termination with the aid of argon ion implantation in a Schottky diode (IEEE Electron Device Letters, Vol. 15, No. 10, Oct.94, Dev Alok et al). This publication, however, only mentions that a thin layer at the surface of a Schottky diode may be passivated, nothing is mentioned about edge termination of a p-n junction consisting of at least two different silicon carbide layers.

SUMMARY OF THE INVENTION

The invention relates to a method wherein proton or ion implantation is used for restructuring a silicon carbide region from being conductive to being resistive and wherein this implantation method is used for manufacturing a semiconductor device which comprises a p-n junction, where both the p-conducting and n-conducting layers are designed as doped layers of silicon carbide (SiC), the implantation method being used in at least one of the steps passivation of a silicon carbide surface of the component with a semi-insulating layer, definition of the area of the p-n junction during the manufacture, termination of the edges of the p-n junction by means of a semi-insulating layer, creation of a positive edge angle at the edge of the p-n junction, and insulation of different components from one another during manufacture of a plurality of components on the same wafer of silicon carbide.

The invention also relates to the implantation method itself.

The process for achieving passivation of the surface and edge termination of a semiconductor device designed in silicon carbide according to the invention is characterized in that the electrical and structural properties at the surface of the silicon carbide are modified in an ion implantation process where a mask is arranged on that surface of the component which is not to be passivated. The surface of the component which is to be modified is subjected to irradiation by ions, preferably protons, whereby the surfaces which may be p- or n-doped silicon carbide during the implantation of ions are given the high resistivity which is desired in the passivating layer by controlling the implantation dose. The depth of the structurally changed surface layer of the component is determined by means of the implantation energy.

By means of the method described it is possible to directly restructure parts of a silicon carbide device, for example the layers in a p-n junction which move up towards the surface, into semi-insulating layers which thereby serve as protective layers. In this way, a planar component may be obtained, where the desired regions of the silicon carbide have been rendered passivating.

If a passivating semi-insulating layer according to the implantation process is used as edge termination of a p-n junction, where the layer has been made resistive with a controlled resistivity, the above-mentioned risk of flashover or breakdown at the edges of the p-n junction is reduced. The passivating layer may also carry a very weak current, which reduces the risk that the passivating layer is charged in that added charges may be discharged by means of weak leakage currents. By controlling the implantation, the passivating layer may be given a desired resistivity.

The passivating layer is chemically identical with the material of the component, since it is formed directly from the component and does not constitute a subsequently deposited layer. This makes the thermal and mechanical properties better adapted to each other, since the component and the layer are formed from the same material sample.

Ion or proton implantation may be used, according to the invention, to achieve SiC semiconductor devices which may be used in practice. The basic idea is to make material regions in silicon carbide, through which current shall not pass, for example the region which surrounds an emitter, semi-insulating by introducing lattice defects and capture mechanisms for charge carriers in the crystal pattern of the silicon carbide. For this purpose, a plurality of different substances may be used during irradiation, but protons are especially suited to reach far into the crystal lattice of a silicon carbide body by the use of available proton energies.

An important advantage of a silicon carbide component, in which a region or a layer has been made semi-insulating, is that the region or layer functions as a passivating layer, a passivation with good thermal properties, for example that the passivating layer has the same coefficient of expansion as the rest of the silicon carbide body. Further, an adapted resistivity for the passivating region is allowed without a permanent charging of the region. The implantation may be made on a plane surface according to so-called planar technique, which is always an advantage, especially when the components become more complicated in their structure.

Implantation according to the method of the invention, contrary to a mesa-structure achieved by means of etching where removal of Sic material is done, means that the removal of SiC material is replaced by a method which instead means that the conductivity in the irradiated region or layer is considerably reduced, whereby the non-desired region with semiconducting SiC need not be removed from the component, which is a considerable advantage.

The implantation technique applied according to the invention may be brought one step further in that a much deeper implant changes the geometrical design of the layer of the component to correspond to a very high mesa-structure. This applies to a p-n junction with an edge angle of 90° (see FIG. 2), which is very favorable with respect to the breakdown voltage compared with the situation in case of a low mesa or a thin implant, at which thin structures an awkward accumulation of electric field arises at the edge of the p-n junction in such a thin structure. The edge of the p-n junction does not become exactly 90° since a somewhat positive edge angle arises in that the ions or the protons penetrate somewhat laterally at an oblique angle under the masked region during implantation. According to the invention, this fact may be utilized explicitly in that the invention provides a possibility of achieving a suitable positive edge angle, which as known has an advantageous influence on the reduction of the electric field at the edge. A positive edge angle is imparted to a p-n junction by subjecting a wafer with one or more components to the implantation irradiation in such a way that the radiation falls against the wafer at an oblique angle while rotating the radiation around the vertical axes of the wafer such that the radiation penetrates obliquely at an angle under the mask at the p-n junction. Being able to achieve a positive edge angle in a simple manner by means of the method and, in addition, the fact that this is possible in a planar component is of the utmost importance.

The advantages with ion or proton implantation described above provide a possibility of creating SiC components which have one or more of the active (doped) layers encapsulated in semi-insulating SiC. In this way, both edge termination at p-n junctions and passivation with one single process step are achieved by means of planar technique. In spite of the fact that high implantation energies are required, this technique seems very promising in comparison with the complex alternative edge termination methods which may occur. The method also allows isolating different components from each other during manufacture of a plurality of components on the same wafer of silicon carbide. The term wafer throughout this description means a plate of silicon carbide on which either one single or a plurality of components are simultaneously produced by means of the methods which are described in this document for one component. When manufacturing a plurality of components on one wafer, these are separated from each other at a later stage in the process.

The layer which is implanted with ions or protons shall not only be very resistive. Other key properties are the temperature dependence, the temperature stability of the created resistivity, the dielectric strength of the implanted SiC layer, and peripheral current leakage across the p-n junction. For all of these properties, favorable values are obtained in the implanted layer achieved by means of the invention.

In the method according to the invention, a perfect structural adaptation is obtained at the boundary layer between the implanted region and the adjoining, non-influenced SiC layer in the component, which it is difficult to obtain when applying a different substance for passivation. A perfect integration is retained with the implantation method, since the implanted layer and the adjoining layer belong to the same crystal. In this way, the advantage is also obtained that the finished component becomes mechanically stable.

As mentioned, it is possible to edge terminate in a known manner by grinding down the edge of the p-n junction. Since a p-n junction designed in SiC is very thin, however, the difficulties of mechanically working the edges at a p-n junction in the SiC are very considerable.

During proton implantation in a silicon carbide layer, the described structural change of the crystal is achieved in a layer at a depth which is determined by the energy with which the proton irradiation is performed. If, according to the invention, a passivation with the structural change according to the invention is made from the surface and downwards in the crystal, various methods may be used. One method of achieving a thicker semi-insulating layer is to perform the proton implantation in several steps with different energy levels or where the implantation energy is controlled over time according to a certain program. According to another method where one proton energy is used and by utilizing a rotating mask, which because the mask has a varying thickness and gives an interval of a varying energy level in the protons which are implanted in the silicon carbide crystal, a coherent structurally changed layer is obtained with the desired thickness and at the desired depth in the crystal. In a modification of the latter method, the mask is maintained stationary while the SiC wafer with the p-n junction is rotated. These latter modifications mentioned may be utilized where only one p-n junction at a time is to be processed.

DESCRIPTION OF THE PREFERRED EMBODIMENTS

The invention will be described in the following with reference to a number of embodiments.

Figure 1:
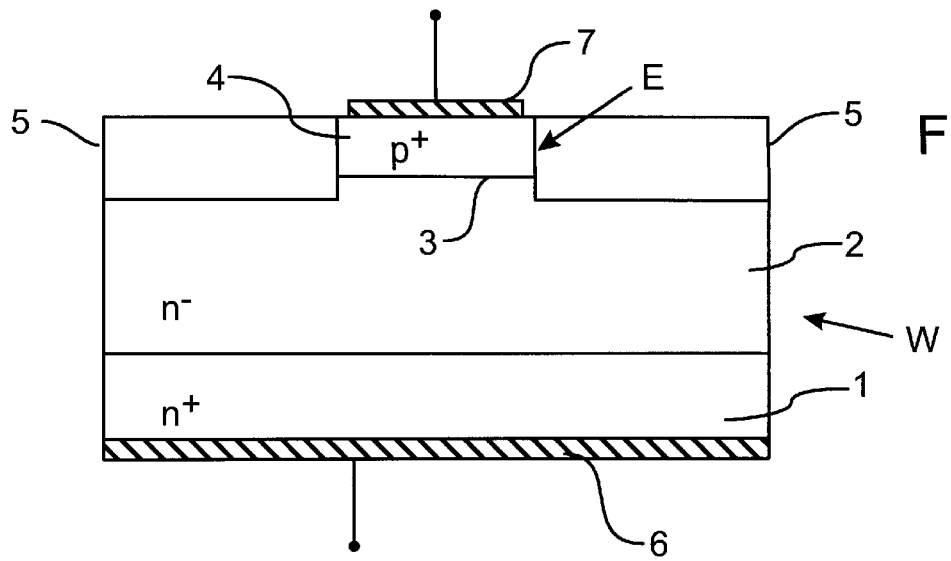
FIG. 1 shows a planar p-n junction which is edge-terminated and passivated in an implantation process according to the invention.

A vertical p-n junction according to FIG. 1 is manufactured by using a commercially procured epitaxially CVD-grown SiC wafer of 6H polytype. The composition of the layers in a wafer W which comprises a component is clear from FIG. 1, where an $n^-$ layer 2 with low doping concentration is built up on an $n^+$ substrate 1 by means of epitaxy. A p-n junction 3 is also produced by epitaxy in the wafer w by epitaxially building up a $p^+$ layer 4 on an $n^-$ layer 2. The layer structure and the dopings are clear from the following table 1, which only denotes values in an example of a one tried embodiment.

TABLE 1

| Layer | Thickness ($\mu$m) | Nom. doping (cm$^{-3}$) | C/V doping (cm$^{-3}$) |
|---|---|---|---|
| $p^+$ layer | 1 | $10^{18}$ | $1.1 \times 10^{18}$ |
| $n^-$ layer | 9 | $10^{16}$ | $1.0 \times 10^{16}$ |
| $n^+$ layer | 0.5 | $10^{18}$ | $6.2 \times 10^{18}$ |
| substrate | 300 | $2 \times 10^{18}$ | $4 \times 10^{18}$ |

Since the shown p-n junction 3 illustrates the utilization of the p-n junction 3 in a diode, the $n^+$ substrate 1 is contacted by means of an n-type contact 6, which may consist of applied Ni or Ti. The $p^+$ layer 4 of the p-n junction is contacted by a contact 7, which in the example consists of applied Al.

After heat treatment to 950° C. for 300 s, Ti, Pt and Au are evaporated on the $p^+$ contact as implantation mask and bond metal.

Figure 6:
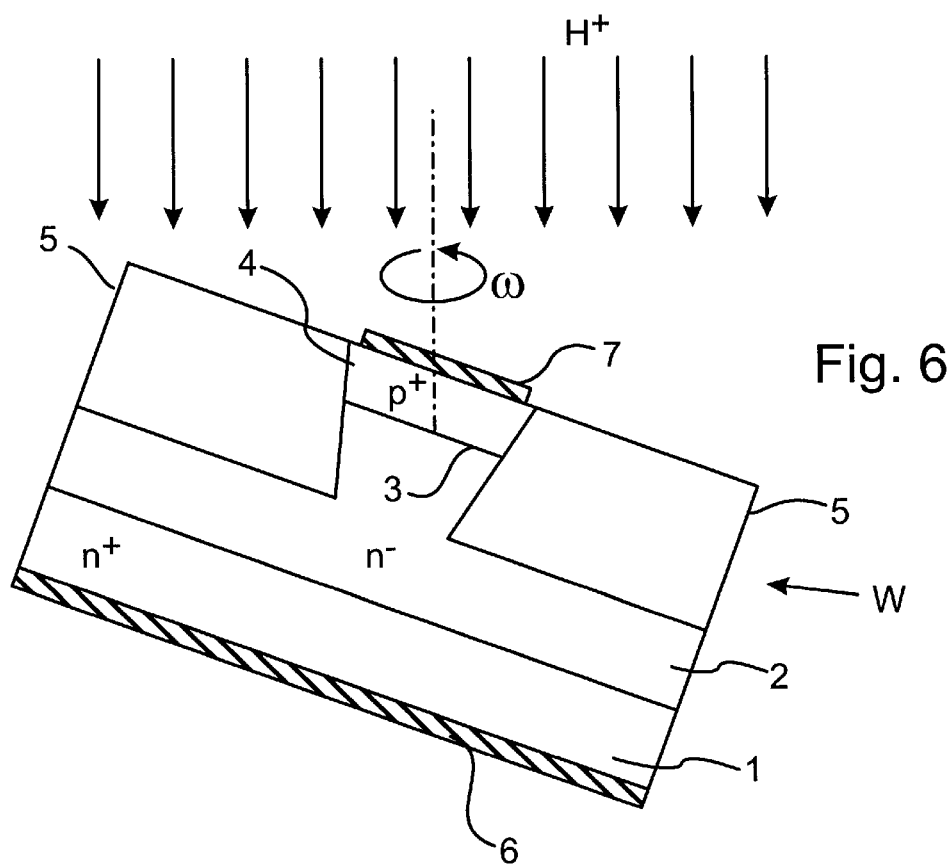
FIG. 6 illustrates the method for implantation when creating a positive edge angle by allowing the radiation to fall at an angle in relation to the wafer of silicon carbide.

When the wafer W has been provided with a mask over the $p^+$ contact 7, ions are implanted to restructure the region of the silicon carbide which surrounds the p-n junction 3 into a depth greater than the depth in the wafer W on which the p-n junction 3 is located. By the proton implantation, a restructuring of peripheral material in the p-n junction 3 is made, such that a definition of the area of the p-n junction and hence a definition of the edges E of the p-n junction are obtained. In the same step, the restructuring of the peripheral material creates a layer 5 with semi-insulating properties surrounding the p-n junction 3. The semi-insulating layer 5 serves as a passivating layer against the surroundings. This semi-insulating layer 5 also contributes to a reduction of the field concentration at the edge E of the p-n junction 3. The semi-insulating layer 5 also achieves a propagation of the field at the edge of the p-n junction. The implantation is carried out with protons in the example, whereby the wafer with the masked p+ contact is irradiated with a number of different energy levels and with different doses such that the restructurings of the crystal achieved by means of the proton irradiation takes place in layers at different depths and such that the different layers overlap one another from the surface of the silicon carbide, down to the desired depth. As an example it may be mentioned that the semi-insulating layer in the component shown in FIG. 1 is obtained by means of proton irradiation in 7 steps with proton energies from 25 keV to 175 keV and with the doses described in table 2 below, where two wafers C and D, respectively, are implanted twice.

tion being tilted during the implantation while at the same time the sample or radiation is rotated, in which case the radiation penetrates to the desired angle below the mask. See FIG. 6. An optimum edge angle is 40 to 45 degrees, but other values may also be chosen. With the proposed proton implantation method, it is possible to achieve a positive edge angle at a p-n junction in a silicon carbide component, which p-n junction on Si components is effected by mechanical grinding of the edge by creating in one process step the positive edge angle, edge termination, and passivation of the surface of the SiC component. Further, this is effected on a planar wafer, which facilitates the handling, while at the same time the passivating, semi-insulating layer 5 is perfectly adapted from a crystalline point of view to the lattice structure of the component, since the proton bombardment only brings about structural changes in the SiC crystal.

Leakage around the p-n junction is not problematic and the breakdown voltage in the implanted component has not been observed to disturb the component function. In addition, the breakdown voltage is increased by the influence exerted by the field plate in the form of the semi-insulating layer 5 on the field around the p-n junction.

Figure 4A:
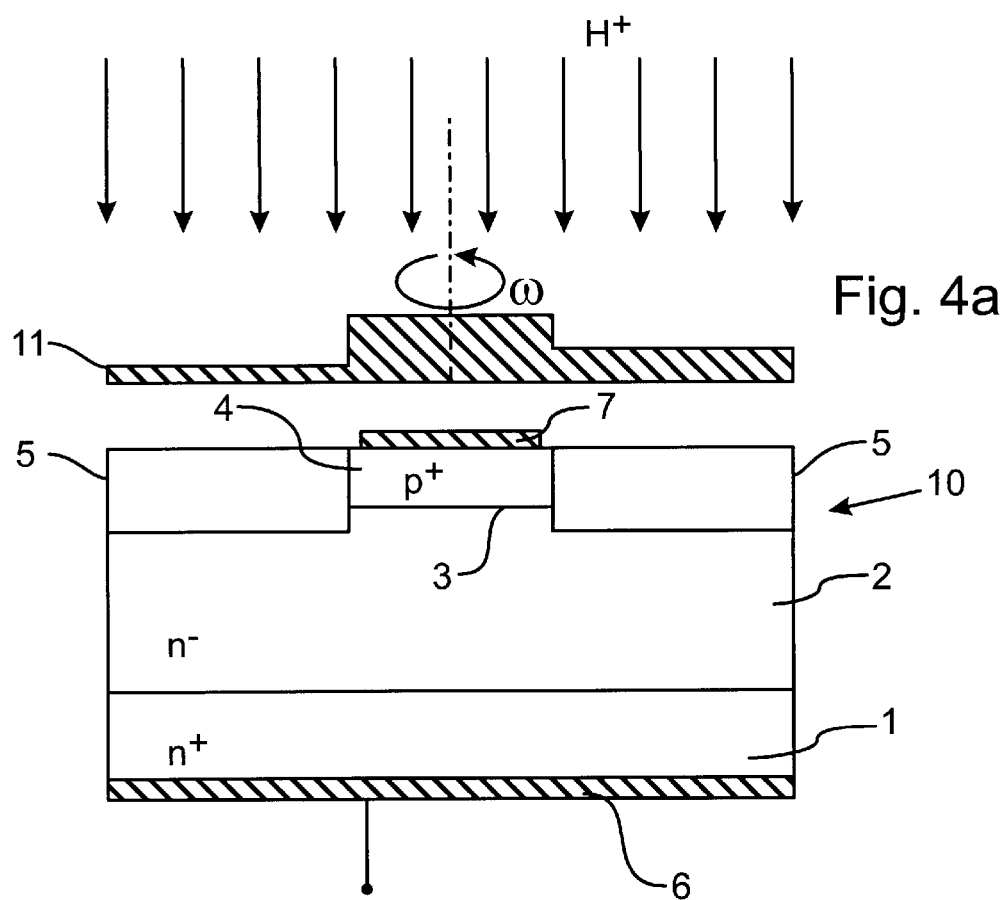
FIG. 4a illustrates a method for achieving the implant with a rotating mask to obtain different energy levels of the irradiation.

In a modified version of the manufacture of the semi-insulating layer 5 or, on the whole, for implanting in silicon carbide by means of proton implantation according to the invention, a method according to FIG. 4a may be used. In this method, the sample 10 to be implanted with protons is

TABLE 2

| Wafer | 175 keV | 150 keV | 125 keV | 100 keV | 75 keV | 50 keV | 25 keV | Unit |
| --- | --- | --- | --- | --- | --- | --- | --- | --- |
| C | 2.2 | 1.7 | 1.5 | 1.4 | 1.2 | 1.2 | 1.2 | $10^{13}$ cm$^{-2}$ |
| D | 2.2 | 1.7 | 1.5 | 1.4 | 1.2 | 1.2 | 1.2 | $10^{13}$ cm$^{-2}$ |
| C | 2.2 | 1.7 | 1.5 | 1.4 | 1.2 | 1.2 | 1.2 | $10^{13}$ cm$^{-2}$ |
| D | 11.0 | 8.5 | 7.5 | 7.0 | 6.0 | 6.0 | 6.0 | $10^{13}$ cm$^{-2}$ |

Figure 5:
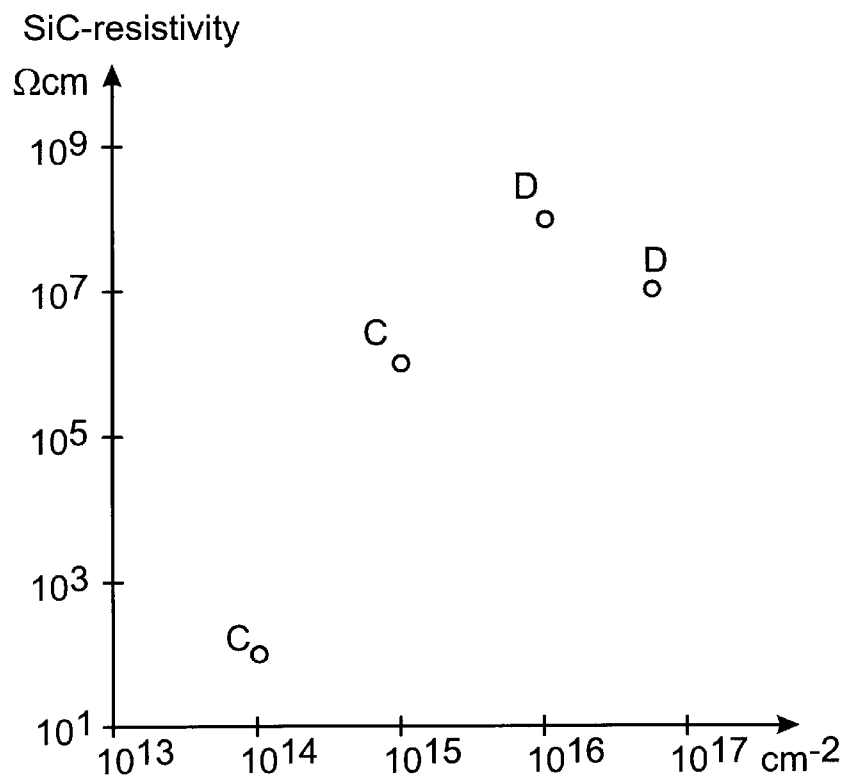
FIG. 5 is a graph showing the resistivity as a function of the total dose, where an SiC preparation is implanted with protons at 7 different energy levels and to a depth of 1.1 $\mu$m.

The result of the implantation is shown in FIG. 5, where the resistivity obtained is given as a function of the total dose in the wafers C and D, whereby the total dose after two irradiations is obtained by adding the implantation dose for the respective wafer. FIG. 5 confirms that the desired resistivity may be obtained for the material by choosing the total dose during the proton implantation.

Figure 7:
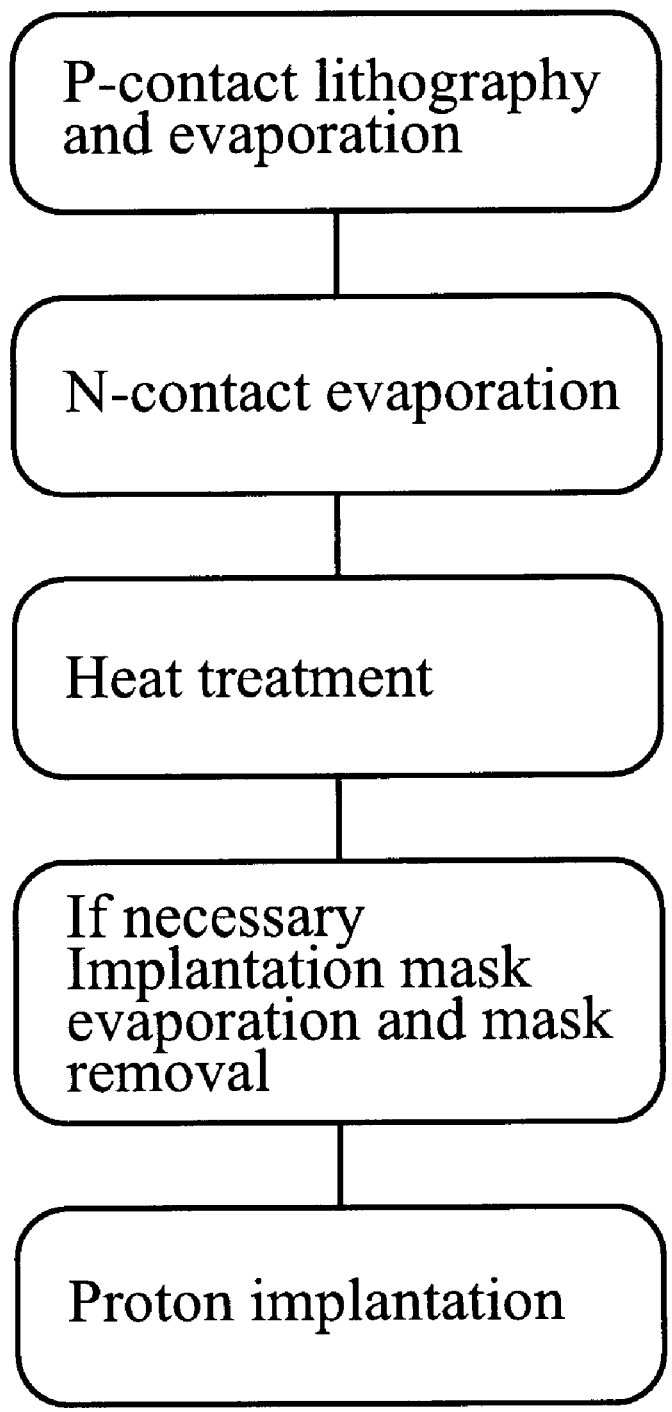
FIG. 7 is a diagram showing the steps in one example of the implementation of the proton implantation.

FIG. 7 illustrates a general flow diagram of the method for implantation to create the desired restructured layer 5.

Figure 2:
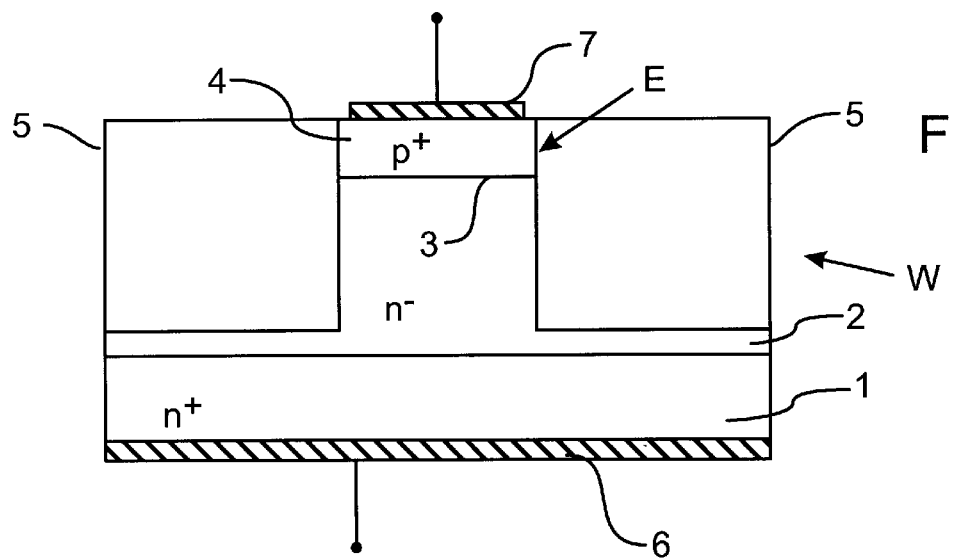
FIG. 2 illustrates a p-n junction with a deep implantation.

FIG. 2 shows a silicon carbide component with a p-n junction according to the invention where the implantation by means of protons is driven to a larger depth in a wafer. The semi-insulating layer 5 adjoining the p-n junction 3 may in this case be driven to a depth in wafer W which is larger than the level which constitutes the limit of the depletion layer, which contributes to reduce the risk of charging of the doped SiC material at the border with the semi-insulating layer 5.

Figure 3:
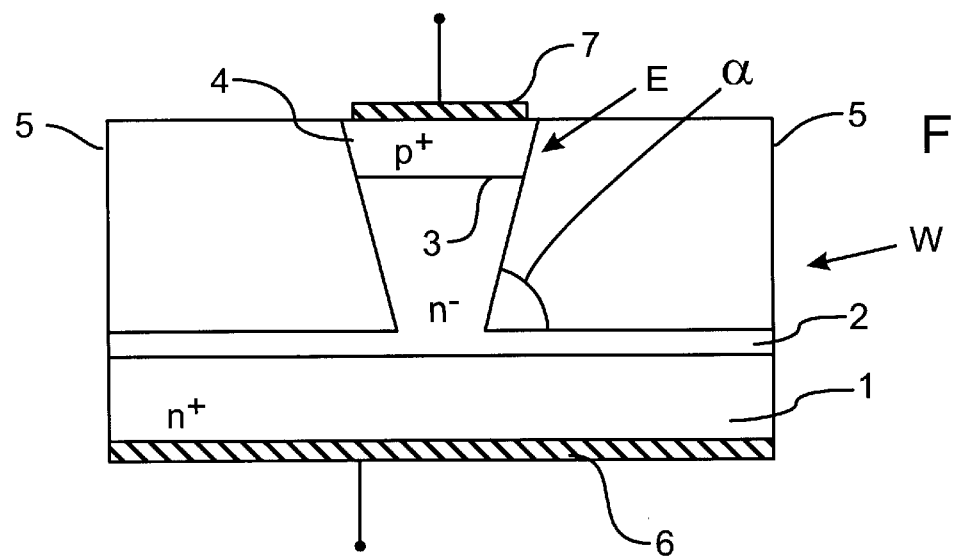
FIG. 3 shows a planar p-n junction which is terminated in a positive edge angle and where the implantation is performed to a greater depth.
Figure 4B:
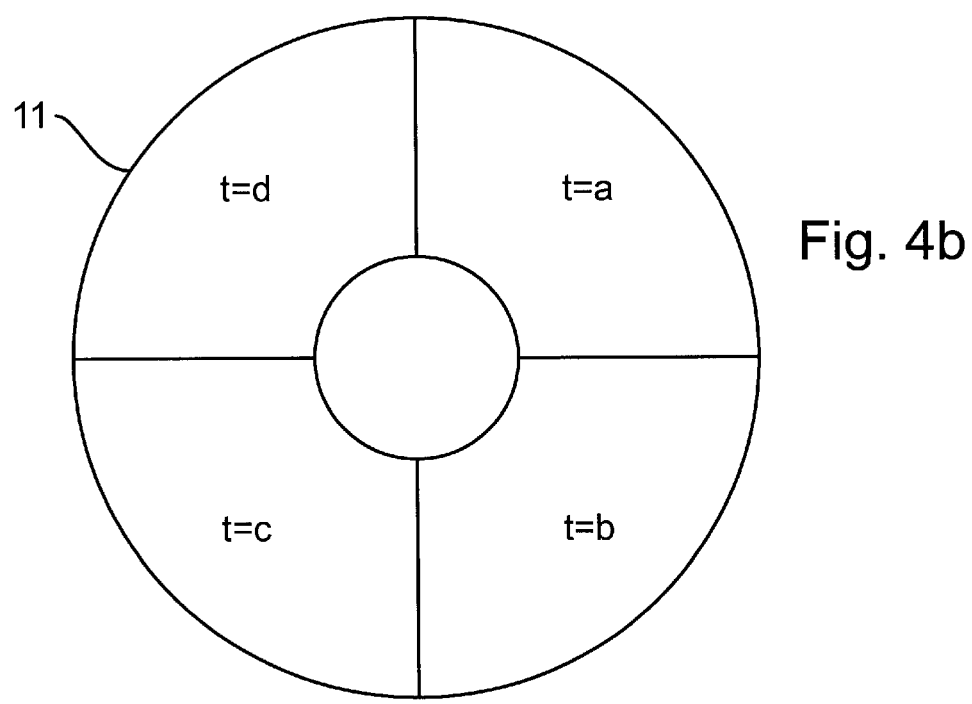
FIG. 4b shows an example of the appearance of the rotating mask with a number of varying thicknesses of the mask material.

Also FIG. 3 shows a p-n junction where the implantation has been driven to a larger depth, but in this example, the edge angle has been made positive, which according to the prior art for Si components, where this edge angle is achieved with a different technique, provides considerably lower field strengths at the edge of the p-n junction. The positive edge angle is achieved by the sample or the radiairradiated by one energy level of protons during the whole implantation process. To obtain the proton energies which are required to achieve the structural changes desired at different depths in the silicon carbide sample 10 (from the surface down to the desired level in a silicon carbide material), this method utilizes a mask 11 with varying thickness which rotates between the sample 10 and the H$^+$ radiation source (not shown). FIG. 4b shows an example of a mask 11, in the form of a circular plate, which is used to achieve the varying energy of the proton radiation which reaches a silicon carbide sample 10. The plate is designed with four different thicknesses a–d in the example shown.

It should also be noted that implantation by means of protons for achieving restructured zones with a desired resistivity must not necessarily take place such that regions in the silicon carbide material are restructured from the surface and down. Layers with semi-insulating properties may also be achieved, located below the surface and interspersed into the material. Further, it is possible to use instead of protons, for example, He$^{2+}$ or D$^+$.

We claim:

1. A method for obtaining a positive edge angle of an edge termination of a p-n junction in a wafer of doped silicon carbide, said method comprising the steps of: masking a region of the p-n junction; and implanting ions at an angle with said p-n junction such that a positive edge angle is obtained, whereupon a layer which surrounds the masked region is restructured into a semi-insulating character, whereby the semi-insulating layer constitutes an edge termination of the edge of the p-n junction.

2. A method according to claim 1, wherein the wafer is irradiated with an ion source, whose radiation energy is unchanged during the implantation and varied radiation energy for the wafer is obtained by means of a device which varies the energy supplied to the wafer.

3. A method according to claim 2, wherein said mask is in the form of a plate of varying thickness inserted between the radiation source and the wafer for varying the radiation energy, the mask or the radiation source being rotated around a vertical axis through the wafer.

4. A method according to claim 1, wherein the layer which surrounds the masked region and is restructured into the semi-insulating character forms a passivating layer.

5. A method according to claim 1, wherein the edge termination is formed by said implantation being performed on a plane silicon carbide wafer.

* * * * *